United States Patent [19]

Rainer

[11] Patent Number: 4,623,872

[45] Date of Patent: Nov. 18, 1986

[54] CIRCUIT FOR CSD-CODING OF A BINARY NUMBER REPRESENTED IN TWO'S COMPLEMENT

[75] Inventor: Alois Rainer, Munich, Fed. Rep. of Germany

[73] Assignee: Siemens Aktiengesellschaft, Berlin & Munich, Fed. Rep. of Germany

[21] Appl. No.: 625,035

[22] Filed: Jun. 27, 1984

[30] Foreign Application Priority Data

Sep. 29, 1983 [DE] Fed. Rep. of Germany ....... 3335386

[51] Int. Cl.[4] ............................................. H03M 5/00
[52] U.S. Cl. ............................................. 340/347 DD
[58] Field of Search .................................. 340/347 DD

[56] References Cited

U.S. PATENT DOCUMENTS 4,271,523 6/1981 Gable .................................... 371/57

OTHER PUBLICATIONS

IEEE Transactions on Acoustics, Speech, and Signal Processing, vol. ASSP-24, No. 1, Feb. 1976, pp. 76–86, by Abraham Peled, entitled "On the Hardware Implementation of Digital Signal Processors".

Primary Examiner—Bernard Roskoski
Attorney, Agent, or Firm—Hill, Van Santen, Steadman & Simpson

[57] ABSTRACT

A circuit for coding a binary number represented in two's complement in a CSD-code wherein it is impossible for two immediately adjacent binary digits to respectively exhibit a "1". The circuit is simply constructed and has a high operating speed. This is achieved by means of a series of logic components which respectively evaluate according to an exclusive-OR function and which create an output bit $-1$ from two respectively adjacent binary digits of the number to be encoded upon appearance of the bit combination 1,0. A series of second logic components create a CSD-coded bit combination 0, 1 from two respectively adjacent first logic components having the output bits $1, -1$, but which accept the output bits of the remaining first logic components into the CSD-coded bit combination in unaltered fashion. The circuit is used in signal processors.

6 Claims, 1 Drawing Figure

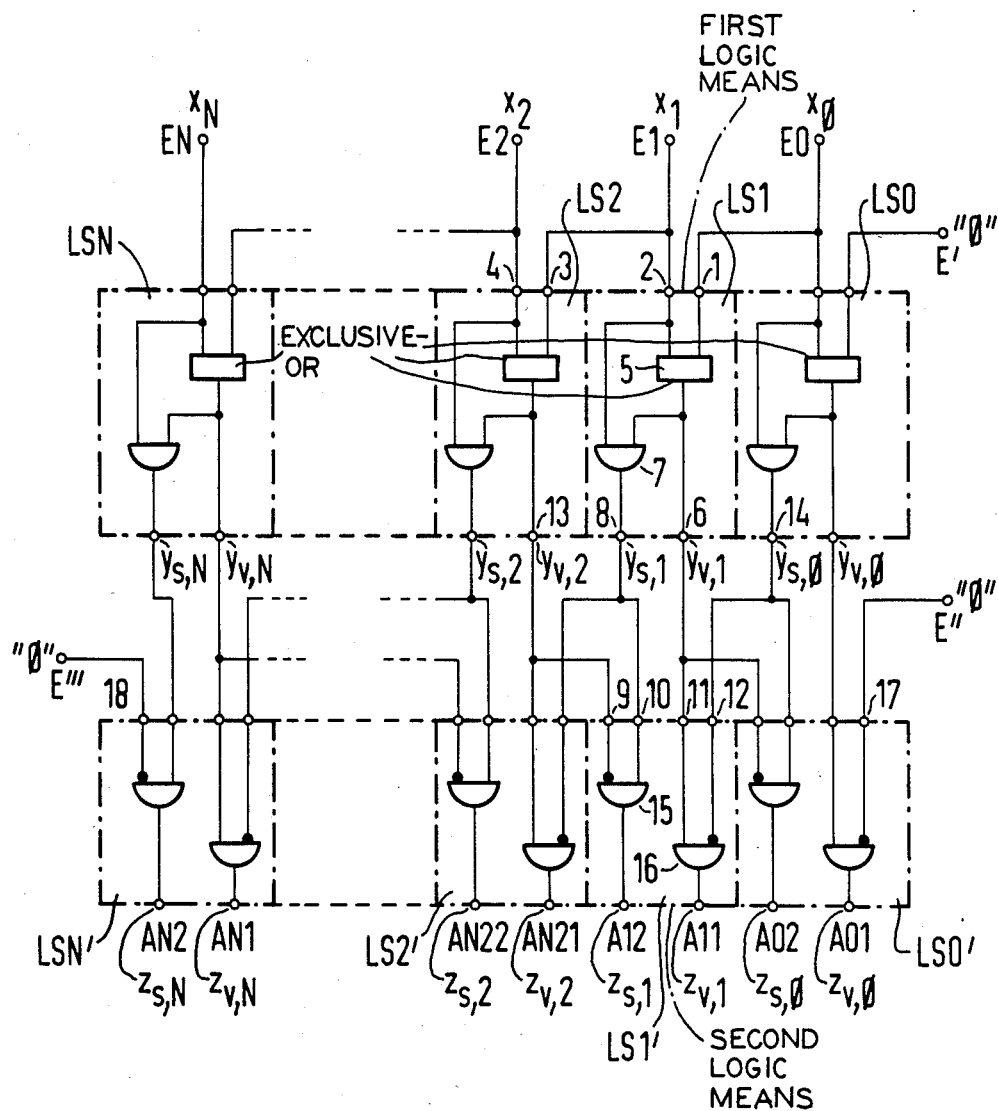

CIRCUIT FOR CSD-CODING OF A BINARY NUMBER REPRESENTED IN TWO'S COMPLEMENT

BACKGROUND OF THE INVENTION

The invention relates to a circuit for CSD-coding of a binary number represented in two's complement.

What is meant by a CSD-code (Canonical-Signed-Digit-Code) is a binary code in which it is impossible for two neighboring binary digits to each have a respective binary "1". This means that so-called "1" blocks are missing in such a binary representation. It can be derived from the periodical "*IEEE Transactions on Acoustics, Speech and Signal Processing*", Vol. ASSP-24, No. 1, February 1976, pages 76–86, incorporated herein by reference, that the CSD-code is primarily employed in digital data processing, particularly for the representation of multipliers, since every "1" bit of such a multiplier denotes an addition or subtraction operation depending on its operational sign. The number of these operations should be kept as low as possible. While about N/2 "1" bits occur on the average given a general binary code of an N-digit number, the average number of such signals is reduced to about N/3 given a CSD code.

SUMMARY OF THE INVENTION

An object of the invention is to specify a circuit for CSD coding of binary numbers wherein the circuit is simply constructed and assures the highest possible operating speed. This is achieved by providing at an input side a plurality of first logic means each having first and second inputs and first and second outputs. One of the first logic means has its first input connected to a given logic level and its second input connected to one of the bits of the binary number. A remainder of the first logic means each have their first and second inputs connected to mutually adjacent binary digit pairs of the binary number being encoded. Each of the first logic means provides at its first output a value bit derived from its two inputs according to an exclusive OR function. Each of the first logic means derives at its second output an operational sign bit comprising a logical "1" only when a higher order of the two bits at the two inputs comprises a logical "1" and a lower-order of the two bits comprises a logical "0". A plurality of second logic means provide at their respective first and second outputs a CSD-coded bit combination of the input binary number. A pair of the second logic means derives a CSD-coded bit combination "0,1" at their outputs wherein an associated pair of first logic means to which they connect output a bit combination "1,−1". An operational sign bit at the second output of a higher-order of the associated pair of first logic means is "0" and its value bit at its first output is "1". An operational sign bit at the second output of a lower-order of the associated pair of first logic means is "1" and its value bit at the first output is "1". Bit combinations at the outputs of all of the remaining first logic means are transferred in unaltered fashion to the outputs of the second logic means as the CSD-coded bit combinations.

BRIEF DESCRIPTION OF THE DRAWINGS

The drawing is a schematic illustration of the circuit for CSD-coding of a binary number representing in two's complement according to the invention.

DESCRIPTION OF THE PREFERRED EMBODIMENTS

The inputs of the circuit according to the invention are referenced E0 through EN. The bits $x_0, x_1 \ldots x_n$ of a binary number are respectively supplied to the inputs, whereby $x_0$ indicates the lowest-order bit and $x_N$ indicates the highest-order bit. Two of these inputs which are immediately adjacent to one another are connected to the two inputs of a logic component. In the drawing, for example, the circuit inputs E0 and E1 are interconnected to the inputs 1 and 2 of the logic component LS1, the circuit inputs E1 and E2 are connected to the inputs 3 and 4 of the logic component LS2, etc. The circuit inputs E(n−1) and EN lie at the inputs of the logic component LSN, whereas the circuit input E0 together with a further circuit input E' that is constantly wired with a "0" is conducted to the input of the logic component LS0.

Of the logic components LS0 through LSN which are all designed identically, only LS1 shall be described in greater detail below. As can be seen from the drawing, the inputs 1,2 of LS1 are connected to two inputs of an exclusive OR element 5 whose output represents the first output 6 of LS1. Furthermore, input 2 which is occupied with the higher-order bit $x_1$ (1, of course, is associated with $x_0$) is connected to the first input of an AND element 7 whose second input is applied to the output of OR gate 5. The output of the AND element 7 forms the second output 8 of LS1. A value bit $y_{v,1}$ that is derived from the two bits $x_0$ and $x_1$ of the input side can be taken at the output 8, whereas an operational sign bit $y_{s,1}$ that is allocated to the value bit $y_{v,1}$ appears at the output 8. $y_{s,1}=0$ thus denotes a positive operational sign, whereas $y_{s,1}=1$ represents a negative operational sign. The value bits $y_{v,0}, Y_{v,2} \ldots y_{v,N}$ to which further operational sign bits $y_{s,0}, y_{s,2} \ldots y_{s,N}$ are allocated are derived from the respective bit pairs (("0", $x_0$), $(x_1,x_x) \ldots (x_{N-1},x_N)$ of the input side via the other logic components LS0, LS2 . . . LSN in the same manner.

Each of the logic components LS0 through LSN has a further logic component LS0' through LSN' allocated to it, whereby the latter are again identically designed, so that only one of them, for example LS1', shall be described in greater detail below. LS1' comprises four inputs 9 through 12, the inputs 10 and 11 thereof being interconnected to the outputs 8 and 6 of LS1. The input 9 is connected to the output 13 of LS2 which is provided for the value bit $y_{v,2}$, whereas the input 12 is conducted to the output 14 of LS0, said output 14 being provided for the operational sign bit $y_{s,0}$. The input 9 is also connected via an inverter to the first input of an AND element 15, whereby said inverter can, as shown, be incorporated into the element 15, whereas the input 10 is wired to the second input of the AND element 15. The input 11 of LS1' is connected to the first input of an AND element 16, whereby the input 12 is conducted via an inverter to the second input of 16. In the drawing, this inverter has again been incorporated into the element 16, whereby the corresponding input of 16 is shown as an inverting input. The outputs of the AND elements 15 and 16 respectively form the outputs A12 and A11 of the further logic component LS1'.

A value bit $z_{v,1}$ that appears at the output A11 is derived from the quantities $y_{s,1}$ and $y_{v,1}$ as well as $y_{v,2}$ and $y_{v,0}$ via LS1'. An operational sign bit $z_{s,1}$ that can be obtained at the output A12 belongs to the value bit and is likewise derived from the quantities $y_{s,1}$ and $y_{v,1}$. Corresponding value bits $z_{v,0}$, $z_{v,2}$ ... $z_{v,N}$ that are respectively available at the outputs A01, A21 ..., AN1 as well as corresponding operational sign bits $z_{s,0}$, $z_{s,2}$ ... $z_{s,N}$ that appear at the outputs A02, A22 ... AN2 are derived in an analogous manner via the further logic components LS0', LS2' ... LSN'.

In general, two of the four inputs in each of the further logic components LS0' ... LSN' are connected to the two outputs of the corresponding logic component LS0 ... LSN, whereas a third input is wired to the value output of the logic component of the next-higher order that is immediately adjacent to the corresponding logic component and the fourth input is wired to the operational sign output of the logic component of the next-lower order that is immediately adjacent to the corresponding logic component. The fourth input 17 of the further logic component LS0' is connected to a circuit input E" that is constantly connected with a "0", whereas the third input 18 of LSN' is wired to a further circuit input E''' that is constantly connected with a "0". The bit combination $z_{v,0}$, $z_{s,0}$ ... $z_{v,N}$, $z_{s,N}$ that is tappable at the outputs A01 through AN2 represents the CSD-coded binary output signal of the circuit that has been derived from the number $x_0$ ... $x_N$ present at the input side.

It is of essential significance to the functioning of the circuit that each of the logic components LS0 ... LSN, for example the element LS1, emits a logical "1" at its value output, for example 6, only when different bits are present at its inputs. Furthermore, a "1" only appears at the corresponding operational sign output, for example 8, of the logic component under consideration when the input bit of higher-order for example $x_1$, consists of a logical "1" but the lower-order input bit, for example $x_0$, consists of a logical "0". Thus only in this case is a negative operational sign assigned to the value bit "1" at the output, for example 6, of the logic component under consideration.

For $x_0=0$ and $x_1=1$, for example, the signals $y_{v,1}=1$ and $y_{s,1}=1$ result. When it is further assumed that $x_2=-$, then the signals $y_{v,2}=1$ and $y_{s,2}=0$ result at the outputs of LS2. Thus, two logic components lying next to one another, namely LS2 and LS1, have an operational-sign affected output-side bit combination 1,−1 so that the higher-order logic component, namely LS2, is cited first. The further logic components allocated to LS2 and LS1, namely LS2' and LS1' result in a CSD-coded bit combination 0,1 only from this bit combination. This corresponds in detail to the following output signals: $z_{v,1}=1$, $z_{s,1}=0$, $z_{v,2}=0$ and $z_{s,2}=0$. It is presumed that the operational sign bit is $y_{s,0}=0$. This, however, derives from the above assumption that $x_0=0$. When the remaining logic components, i.e. LS0, LS3 .. . LSN exhibit no such bit combinations at the output side when considered in pairs, then their bit combinations, i.e. the signals $y_{v,0}$, $y_{s,0}$, $y_{v,3}$ ... $y_{v,N}$, $y_{z,N}$ are transmitted unaltered into corresponding signals at the outputs of the further logic components, i.e. $z_{v,0}$, $z_{s,0}$, $z_{v,3}$, $z_{s,3}$ ... $z_{v,N}$, $z_{s,N}$.

When one considers the function of a further logic component, for example LS1', then one can see that a CSD-coded value bit $z_{v,1}$ can be tapped at its value output A11, the value bit corresponding to the value bit $y_{v,1}$ supplied from the allocated logic component when the operational sign bit $y_{s,0}$ supplied from the neighboring, lower-order logic component consists of a logical "0". Otherwise, the input-side value bit $y_{v,1}$ is negated when the operational sign bit $y_{s,0}$ consists of a logical "1". A CSD-coded operational sign bit $z_{s,1}$ can be obtained at the operational sign output A12 of the further logic component LS1', said CSD-coded operational sign bit corresponding to the operational sign bit $y_{s,1}$ supplied from the corresponding logic component when the value bit $y_{v,2}$ supplied from the neighboring, higher-order logic component consists of a logical "0", whereas a logical "1" of this value bit leads to a negation of the supplied operational sign bit $y_{s,1}$. The function of the logic components LS0', LS2' ... LSN' is analogous to the function of LS1' described above.

Although various minor changes and modifications might be proposed by those skilled in the art, it will be understood that I wish to include within the claims of the patent warranted hereon all such changes and modifications as reasonably come within my contribution to the art.

I claim as my invention:

1. A circuit for CSD-coding of signals corresponding to a binary number being input represented in two's complement, comprising:

at an input side a plurality of first logic means each having first and second inputs and first and second outputs;

one of the first logic means having its first input connected to a given logic level and its second input connected to a signal corresponding to one of the bits of the binary number, a remainder of the first logic means each having their first and second inputs connected to signals corresponding to mutually adjacent binary digit pairs of the binary number being encoded;

each of said first logic means providing at its first output a signal corresponding to a value bit derived from its two inputs according to an exclusive OR function;

each of said first logic means deriving at its second output a signal corresponding to an operational sign bit comprising a logical "1" only when a signal corresponding to a higher order of the two bits at the two inputs comprises a logical "1" and a signal corresponding to a lower-order of the two bits comprises a logical "0";

a plurality of second logic means for providing at their respective first and second outputs signals corresponding to a CSD-coded bit combination of the input binary number signals;

each pair of directly adjacent ones of said second logic means deriving signals corresponding to a CSD-coded bit combination 0,1 at their outputs from an associated pair of first logic means to which they connect outputting signals corresponding to a bit combination "1, −1";

a signal corresponding to an operational sign bit at the second output of a higher-order of the associated pair of first logic means being "0" and a signal corresponding to its value bit at its first output being "1";

a signal corresponding to an operational sign bit at the second output of a lower-order of the associated pair of first logic means being "1" and a signal corresponding to its value bit at the first output being "1"; and signals corresponding to bit combinations at the outputs of all of the remaining first logic means being transferred in unaltered fashion to the outputs of the second logic means as the CSD-coded bit combinations.

2. A circuit according to claim 1 wherein each of said second logic means comprises four inputs and two outputs; the four inputs being respectively supplied with the value bit signal and the operational sign bit signal of one of the first logic means, with the operational sign bit signal of the first logic means directly adjacent said one first logic means in a direction toward lower binary orders, and with the value bit signal of the first logic means directly adjacent said one first logic means in a direction toward the higher binary orders; a signal corresponding to a CSD-coded value bit being provided at said first output, said CSD-coded value bit signal corresponding to the value bit signal of said one first logic means when the operational sign bit signal supplied from the first logic means directly adjacent said first one logic means is logical "0", and corresponding to the negated value bit signal of said one first logic means when the last mentioned operational sign bit signal is a logical "1"; and a signal corresponding to a CSD-coded operational sign bit at said second output of the second logic means which corresponds to the operational sign bit signal supplied from said one first logic means when the value bit signal supplied from the adjacent first logic means comprises a logical "0", and said CSD-coded operational sign bit signal corresponds to the negated operational sign bit signal supplied from said one first logic means when the last mentioned value bit signal is a logical "1".

3. A circuit according to claim 1 wherein each of the first logic means contains an exclusive-OR element and a first AND element, two inputs of said exclusive-OR element represent the first and second inputs of the first logic means; a first input of said first AND element being connected to the second input of the first logic means occupied with the higher-order bit signal; the second input of said first AND element being connected to the output of said exclusive-OR element; and an output of said exclusive-OR element being the first output for the value bit signal and the output of said first AND element forming the second output for the operational sign bit signal.

4. A circuit according to claim 1 wherein each of the second logic means contains a second and a third AND element; two inputs of said second AND element being respectively connected to the second output of a corresponding first logic means provided for the operational sign bit signal and via an inverter to the first output of the immediately adjacent, higher-order first logic means provided for the value bit signal; two inputs of said third element being respectively connected to the first output of the corresponding first logic means provided for the value bit signal and via an inverter to the second output of the immediately adjacent, lower-order first logic means which is provided for the operational sign bit signal; and an output of said third AND element being the first output for the CSD-coded value bit signal of the second logic means, and the output of said second AND element forms the second output for the CSD-coded operational sign bit signal of the second logic means.

5. A circuit for CSD-coding of signals corresponding to a binary number being input represented in two's complement, comprising:
a plurality of input logic means each having a lower-order bit signal input, a higher-order bit singal input, an intermediate value bit signal output and intermediate operational sign bit signal output for signals corresponding to a given binary number input;
a lowest order of the input logic means having a signal corresponding to its lower-order bit input connected to a fixed logic level and a signal corresponding to its higher-order input connected to a signal corresponding to a lowest order bit of the binary number;
the remaining input logic means having their lower-order and higher-order bit signal inputs connected to signals corresponding to respective and adjacent lower and higher order bit pairs of the binary number;
a plurality of output logic means for converting the intermediate value and operational sign bit signal outputs to a CSD-coded bit combination signal output representative of the input binary number signals;
each of said output logic means having first, second, third, and fourth signal inputs and a CSD-coded value bit signal output and operational sign bit signal outputs;
each output logic means second input connecting to the operational sign bit signal output of one of the input logic means and, except for the highest order output logic means, also to the fourth signal input of an adjacent output logic means, each first signal input connecting to the value bit signal output of a next higher-order input logic means and also to the third signal input of the next higher-order adjacent output logic means except for the highest order output logic means whose first signal input connects to a fixed logic level, each third signal input connecting to the value bit signal output of said one input logic means and except for the lowest order output logic means also to the first signal input of the adjacent lower-order output logic means, and except for the lowest order output logic means, each fourth signal input connecting to the operational sign bit signal output of the next lower-order input logic means and also to the second signal input of the next lower-order adjacent output logic means, the lowest order output logic means fourth input connecting to a fixed logic level.

6. A circuit according to claim 5 wherein the input logic means comprises an OR element connecting to an AND element, and wherein the output logic means comprises two AND elements each having one of their inputs connecting to an inverter element.

* * * * *